US011139217B2

(12) United States Patent
Zimmerman et al.

(10) Patent No.: US 11,139,217 B2
(45) Date of Patent: Oct. 5, 2021

(54) POST-PRODUCTION SUBSTRATE MODIFICATION WITH FIB DEPOSITION

(71) Applicant: BAE Systems Information and Electronic Systems Integration Inc., Nashua, NH (US)

(72) Inventors: Jeffrey A. Zimmerman, Manassas, VA (US); Landon J. Caley, Fredricksburg, VA (US); Richard J. Ferguson, Bealeton, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 185 days.

(21) Appl. No.: 16/564,676

(22) Filed: Sep. 9, 2019

(65) Prior Publication Data

US 2021/0074595 A1   Mar. 11, 2021

(51) Int. Cl.
*C23C 16/48*    (2006.01)
*H01L 21/66*   (2006.01)
(Continued)

(52) U.S. Cl.
CPC ............. *H01L 22/22* (2013.01); *B05D 5/12* (2013.01); *C23C 14/14* (2013.01); *C23C 14/221* (2013.01);
(Continued)

(58) Field of Classification Search
CPC ....... C23C 14/14; C23C 16/047; C23C 16/06; C23C 16/486; C23C 16/48; H01L 22/22
See application file for complete search history.

(56) References Cited

U.S. PATENT DOCUMENTS 5,838,159 A  *  11/1998  Johnson .............. G01R 1/0483
                                                    324/754.08
6,540,527 B1 *   4/2003  Tamarkin .............. H01R 12/62
                                                    439/67
(Continued)

OTHER PUBLICATIONS

Swathi, M.N., et al., "Error Detection In Printed Circuit Board Assembly". International Journal of Engineering Research & Technology (IJERT) vol. 6, Issue 13, 2018, pp. 1-4. ISSN: 2278-0181, NCESC—2018 Conference Proceedings.*
(Continued)

*Primary Examiner* — Bret P Chen
(74) *Attorney, Agent, or Firm* — Sand, Sebolt & Wernow LPA; Scott J. Asmus

(57) ABSTRACT

A method for modifying a portion of a substrate after production is described herein. The method can include diagnosing a circuit operation error causing a malfunction, identifying a first contact on the substrate, and connecting, electrically, the first contact to a second contact with at least one trace. The trace is done with a focused ion beam. The method can include diagnosing an error on an operative area of a post-manufacture circuit board causing a malfunction; introducing a metal precursor into a focused ion beam chamber; ionizing the metal precursor by contacting it with a gallium ion beam into a conductive metal and a further ion; depositing a first portion of a conductive metal onto a substrate to form a first trace; and forming the first trace between the operative area and a non-operative area thereby connecting the operative area and the non-operative area.

16 Claims, 5 Drawing Sheets

(51) Int. Cl.
  *H01L 21/48* (2006.01)
  *H05K 3/22* (2006.01)
  *C23C 14/14* (2006.01)
  *C23C 14/22* (2006.01)
  *C23C 16/04* (2006.01)
  *C23C 16/06* (2006.01)
  *B05D 5/12* (2006.01)

(52) U.S. Cl.
  CPC ............ *C23C 16/047* (2013.01); *C23C 16/06* (2013.01); *C23C 16/486* (2013.01); *H01L 21/485* (2013.01); *H05K 3/225* (2013.01); *H05K 2203/092* (2013.01); *H05K 2203/162* (2013.01)

(56) References Cited

U.S. PATENT DOCUMENTS

| | | | | |
|---|---|---|---|---|
| 6,784,677 | B2* | 8/2004 | Miller | G01R 1/07378 324/750.3 |
| 6,802,720 | B2* | 10/2004 | Weiss | H01R 13/2414 439/591 |
| 2003/0224543 | A1* | 12/2003 | Roy | H01J 37/3005 438/16 |
| 2004/0080334 | A1* | 4/2004 | Vergnes | H03K 19/17796 326/10 |
| 2005/0191767 | A1* | 9/2005 | Edwards | H01L 21/76892 438/4 |
| 2008/0090403 | A1* | 4/2008 | Schlangen | H01L 21/76898 438/599 |
| 2008/0301615 | A1* | 12/2008 | Wang | H01J 37/3026 716/126 |
| 2009/0081891 | A1 | 3/2009 | Hougham et al. | |
| 2009/0114912 | A1* | 5/2009 | Large | H01L 22/22 257/48 |
| 2015/0323583 | A1* | 11/2015 | Liao | G01R 31/66 324/754.22 |
| 2015/0380365 | A1* | 12/2015 | Dyka | H01L 23/5286 257/774 |
| 2016/0050751 | A1* | 2/2016 | Amirkiai | H05K 3/4682 361/752 |
| 2018/0330918 | A1* | 11/2018 | Varadan | G01Q 30/02 |

OTHER PUBLICATIONS

Freescale Semiconductor Application Note: "Land Grid Array (LGA) Package Rework". Document No. AN3241, Rev. 1.0, Oct. 2009, pp. 1-16.*

Sauveplane, J.B., et al., "A reliable solderless connection technique for high I/O counts ceramic land grid array package for space applications". Microelectronics Reliability 55 (2015) 1815-1820.*

Maxim Integrated Application Note 6407: "Power Module Land Grid Array (LGA) Packaging and its Applications". AN6407, 2014, pp. 1-5.*

De Marzi, G., et al., "Probing intrinsic transport properties of single metal nanowires: Direct-write contact formation using a focused ion beam". Journal of Applied Physics, vol. 96, No. 6, Sep. 15, 2004, pp. 3458-3462.*

Motayed, Abhishek, et al., "Fabrication of GaN-based nanoscale device structures utilizing focused ion beam induced Pt deposition". Journal of Applied Physics, vol. 100 Issue 2 (2006) 024306, pp. 1-8.*

Chen, Ruei-San, et al., "Ohmic Contact Fabrication Using a Focused-ion Beam Technique and Electrical Characterization for Layer Semiconductor Nanostructures". Journal of Visualized Experiments, Dec. 2015, 106, e53200, pp. 1-10.*

Demarco, Anthony J., et al. "Contact resistance of focused ion beam deposited platinum and tungsten films to silicon". J. Vac. Sci. Technol. B 19(6), Nov./Dec. 2001, pp. 2543-2546.*

Stewart, D.K., et al., "Focused-ion-beam induced deposition of metal for microcircuit modification". Proc. SPIE 1089, Electron Beam, X-Ray, and Ion-Beam Technology: Submicrometer Lithographies VIII, (Aug. 1, 1989); pp. 18-25. doi: 10.1117/12.968510.*

* cited by examiner

POST-PRODUCTION SUBSTRATE MODIFICATION WITH FIB DEPOSITION

STATEMENT OF GOVERNMENT INTEREST

This invention was made with government support under Contract No. 13-C-0006 awarded by a classified agency. The government has certain rights in the invention.

TECHNICAL FIELD

The present disclosure relates generally to a method for modifying a land grid array (LGA) package after production. In one example, the present disclosure relates to modifying an LGA package by shorting contacts together via a trace.

BACKGROUND

A land grid array (LGA) is a type of surface mounted packaging for integrated circuits (IC). Traditionally the pins are located on the socket (when a socket is used) rather than on the integrated circuit itself. The LGA may be electrically connected to any printed circuit board (PCB) by use of a socket or soldering directly onto the PCB.

Generally, the LGA is a rectangular grid of a plurality of contacts, or pads, located on the underside of a package. These contacts, or pads, are connected to a grid of contacts on the PCB. At times, not all rows and columns of the grid need to be used. Contacts can either be made by using the LGA socket or by utilizing solder columns. Design of the LGA can reduce the amount of heavy metals such as lead in systems, and allowing it to conform to various regulations such as Restrictions of Hazardous Substances directives, while also helping with thermal dissipation.

The LGA differs from a ball grid array (BGA) and a pin grid array (PGA). In contrast with BGA, the LGA package in non-socketed configurations have no balls, and instead utilize flat contacts which may be soldered onto the PCB. While the BGA utilizes balls which are attached to the underside of the IC. Similarly, the PGA differs from the LGA in that their packages cannot be soldered down using surface mount technology. Often, the PGA are mounted using the through hole method, by inserting a pin into a socket on the PCB.

However, the conventional LGA tends to be very brittle and must be installed in a very specific way with much care so as not to touch the pads as well as installing the LGA correctly by not attaching the LGA at an angle to the socket. Any bent contact on a socket may not allow the LGA to properly interface with the connections underneath. Additionally, any pad that may get contaminants such as oil from handling with bare hands, or otherwise marred or damaged, may be completely non-operational. Additionally, at times the LGA may have a dead contact with no prior known trauma to the unit. As a result, a specialty part, or the entire PCB entirely may need to be respun in order to fix this defect. This may lead to delays in processing as well as increased costs relating to the respin.

SUMMARY

In one aspect, an exemplary embodiment of the present disclosure provides a method 0f modifying a portion of a substrate after production, said method comprising: diagnosing a circuit operation error causing a malfunction, identifying a first contact on the substrate, and connecting, electrically, the first contact to a second contact with at least one trace, wherein the trace is done with a focused ion beam. An exemplary embodiment provides that connecting further comprises: introducing the focused ion beam to the substrate containing the first contact and the second contact, and forming a layer of metal over the substrate resulting in an electric connection between the first contact and the second contact. An exemplary embodiment provides prior to forming comprises: presenting a metal precursor into a reaction chamber containing the substrate, and ionizing the metal precursor with the focused ion beam into a metal portion and a further portion. An exemplary embodiment provides the ion beam is a gallium ion beam. An exemplary embodiment provides forming further comprises: depositing a layer of conductive metal on the substrate thereby electrically connecting the first contact to the second contact. An exemplary embodiment provides the conductive metal is platinum. An exemplary embodiment provides the conductive metal is tungsten. An exemplary embodiment provides executing a program with instructions dependent on data bearing records to form the layer. An exemplary embodiment provides forming at least one additional connection between the first contact to the second contact. An exemplary embodiment provides the first connection is a first metal trace line and the at least one additional connection is at least one further metal trace line that is offset parallel to the first metal trace line. An exemplary embodiment provides the trace is in a range from about 3 µm to about 7 µm thick. An exemplary embodiment provides the trace is about 5 µm thick. An exemplary embodiment provides the trace is in a range from about 20 µm to about 60 µm wide. An exemplary embodiment provides the trace is about 40 µm wide.

In another aspect, an exemplary embodiment of the present disclosure provides a method for repairing a circuit board for a manufacturing defect, the method comprising: diagnosing an error on an operative area of a post-manufacture circuit board causing a malfunction, introducing a metal precursor into a focused ion beam chamber, ionizing the metal precursor by contacting it with a gallium ion beam into a conductive metal and a further ion, depositing a first portion of a conductive metal onto a substrate to form a first trace, and forming the first trace between the operative area and a non-operative area thereby connecting the operative area and the non-operative area. This exemplary embodiment or another may provide depositing a second portion of a conductive metal onto a substrate to form a second trace; and forming the second trace between the operative area and the non-operative area thereby connecting the operative area and a further area. In exemplary embodiments the conductive metal is comprised of tungsten, or platinum. In an exemplary embodiment the first trace and second trace are about 5 µm thick and about 40 µm wide. A further embodiment provides for depositing at least one further portion of conductive metal onto a substrate to form a plurality of traces; and forming the plurality of traces between the operative area and the further area.

In yet another aspect, an exemplary embodiment of the present disclosure provides a method of modifying a portion of a circuit board after production, said method comprising: diagnosing a circuit operation error causing a malfunction, identifying a first contact on the circuit board, and connecting, electrically, the first contact to a second contact with at least one trace, wherein the trace is done with a focused ion beam.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

A system and method of operation thereof is depicted in the present disclosure and throughout FIGS. 1-6. The method is a new and improved way to modify an LGA package, as will be discussed hereafter.

Figure 1:
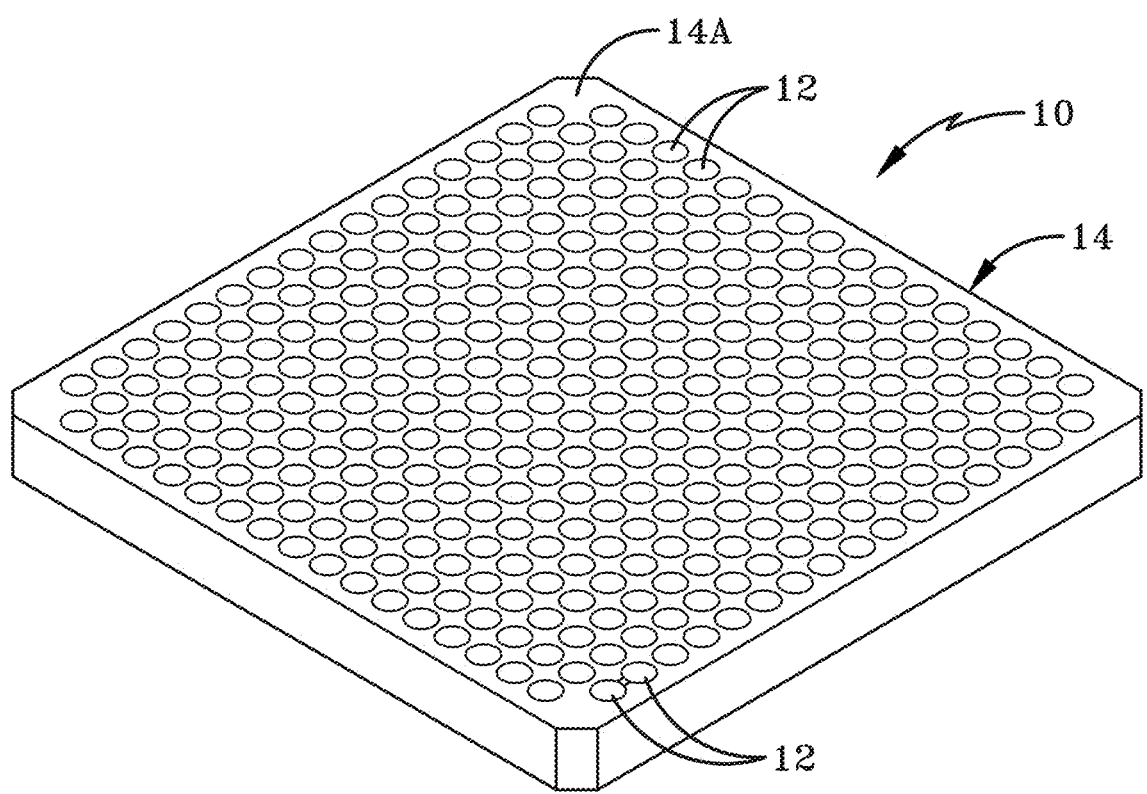
FIG. 1 shows a right front elevation view of an exemplary LGA package with a plurality of contacts.

Referring now to FIG. 1, an exemplary LGA package 10 is shown. The exemplary LGA package includes a plurality of contacts 12 that are operative to be electrically connected to an IC and a circuit board (not shown). Each contact 12 is made of a conductive metal. In exemplary embodiments the contacts 12 are comprised of gold.

Each contact 12 may have a different function or have varied functions for the circuit overall. Some contacts 12 may not be routed to a function and instead are blank. In an exemplary embodiment, the contacts 12 are circular in nature although they may also be oval shaped. The contacts 12 are on a surface 14A of a substrate 14. The substrate 14 in one example is made of a non-conductive material. While two contacts are coupled in this example, additional contacts such as three or four contacts can also be done by providing one or more traces to the other contacts. Furthermore, while coupling to an adjacent contact is shown, there may be instances where the nearest contact is not the closest contact. One embodiment is for routing the traces to one or more contacts that are not the nearest contacts. As used herein, when a contact is said to be malfunctioning, this may refer to the contact itself which is malfunctioning, or the underlying integrated circuit which is malfunctioning, or other such similarly situated wiring to which the contact interfaces.

Figure 2:
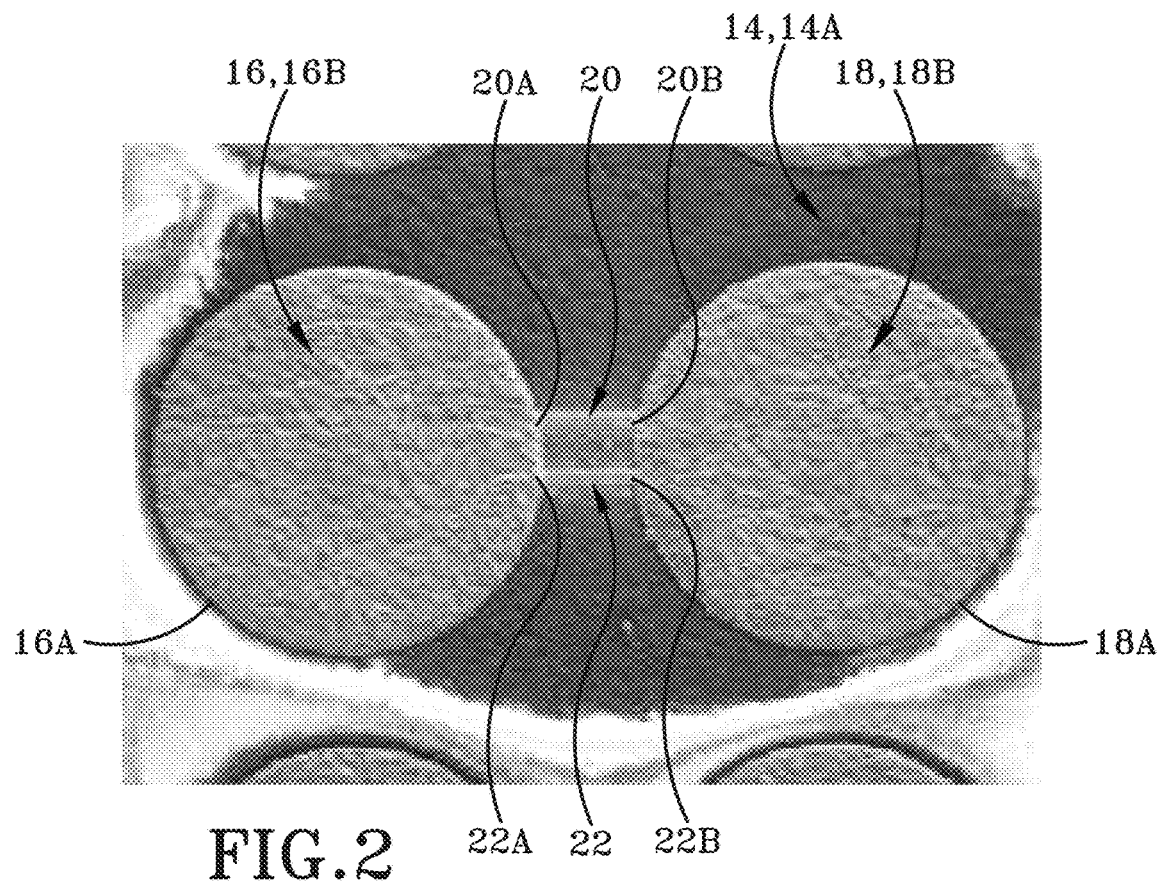
FIG. 2 shows a scanning electron microscopy image of two exemplary contacts on an exemplary LGA package connected by a trace.
Figure 3:
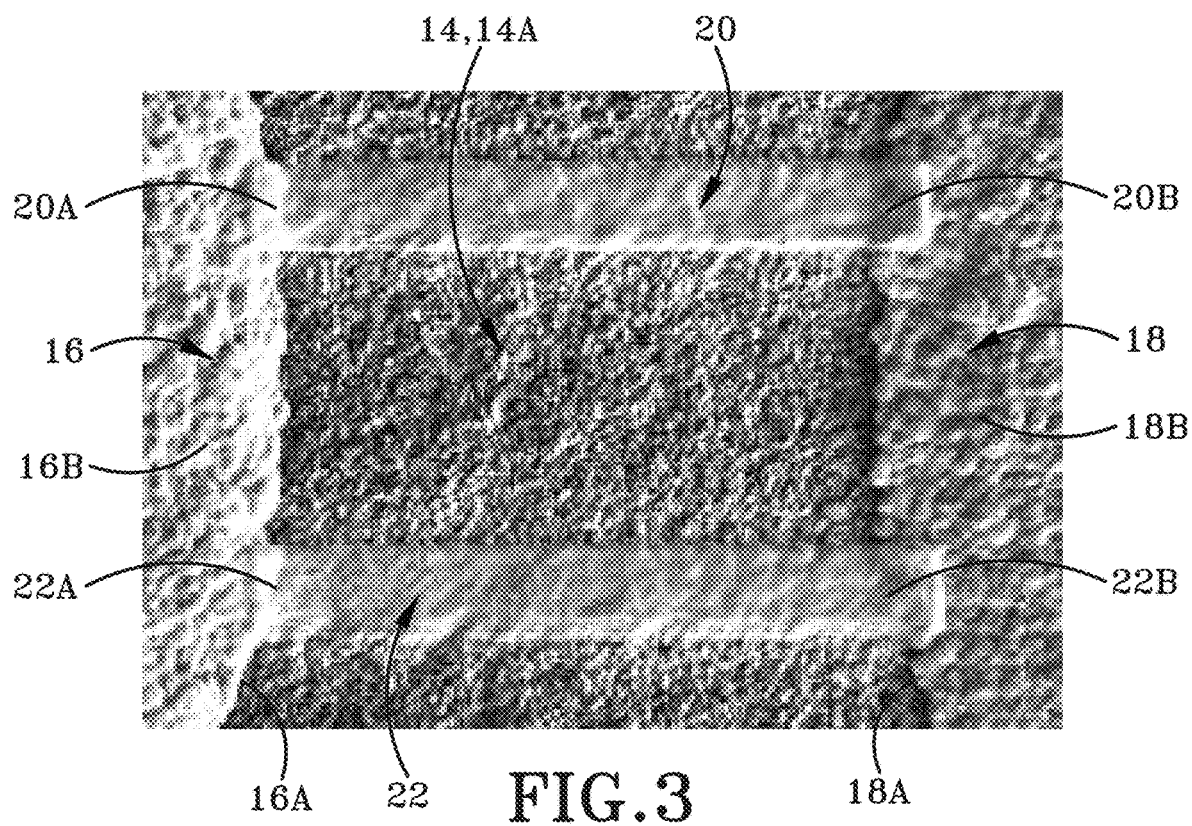
FIG. 3 shows a scanning electron microscopy image of two exemplary contacts on an exemplary LGA package connected by a trace at higher resolution.

FIG. 2 and FIG. 3 are scanning electron microscopy images of two exemplary contacts 16, 18 on an exemplary LGA package 10 that are connected by traces 20, 22 while on an exemplary substrate 14. Referring specifically to FIG. 2, the image is taken at a 10.0 kV electron acceleration voltage with a 9.0 mm working distance at 60 times magnification. The two exemplary contacts 16, 18 each have an outer perimeter edge 16A, 18A as well as an interior area 16B, 18B bound by the outer perimeter edge 16A, 18A respectively. The two traces 20, 22 connect the two exemplary contacts 16, 18. Each trace 20, 22 respectively has a first end 20A, 22A and second end 20B, 22B opposed to the first end 20A, 22A. The traces 20, 22 span from one contact 16 to another 18 and overlap at least a portion of the outer perimeter edge 16A, 18A as well as a portion of the interior area 16B, 18B with their first ends 20A, 22A and second ends 20B, 22B. Additionally, each trace 20, 22 extends over a surface 14A of substrate 14. Surface 14A does not conduct electrons therethrough such that its contact with traces 20, 22 does not short the same.

The traces 20, 22 in this example are generally rectangular in nature and are about 1-9 μm in thickness, or depth, with a width of about 20-60 μm. The length of the traces 20, 22 is dependent on the distance the contacts 16, 18 are spaced apart. In an exemplary embodiment the traces 20, 22 are about 3-7 μm in thickness with a width of about 30-50 μm. In a further embodiment the traces 20, 22 are about 5 μm in thickness with a width of about 40 μm. While two traces were employed in this example to provide some redundancy, a single trace suffices. A single trace can also be made wider and with less precision/time as two individual traces. In another embodiment, more than two traces can be used such as three traces to enable the desired redundancy.

According to one embodiment, the traces 20, 22 are durable, low resistance traces. The traces may be made of any conductive metal or metals that are durable and chosen for their specific properties. In an exemplary embodiment the metal is or comprises platinum. Platinum has an exceptional resistance to oxidation and corrosion. As such, platinum traces will provide a highly stable resistance. Platinum may also be alloyed with other metals in order to tailor the properties for the desired use for the LGA package 10 as a whole. In a further embodiment the metal is or comprises tungsten. Tungsten is a very hard metal with an excellent resistance to wear with very high melting and boiling points. Tungsten has the highest minimal arcing current, is highly resistant to electrical erosion. Further metals have been contemplated for the traces and may be used with principles found to those skilled in the art. In the exemplary embodiment the contacts 16, 18 are made of gold.

FIG. 3 depicts an enlarged image of FIG. 2 of the two exemplary contacts 16, 18 on the exemplary LGA package 10 that are connected by the traces 20, 22 while on an exemplary substrate 14 is shown. The image is taken at a 10.0 kV electron acceleration voltage at 400 times magnification. In this view, it is clear that the traces 20, 22 at both the first ends 20A, 22A and second ends 20B, 22B, extend internal the outer perimeter edge 16A, 18A of each contact 16, 18 and into the interior area 16B, 18B.

Figure 4:
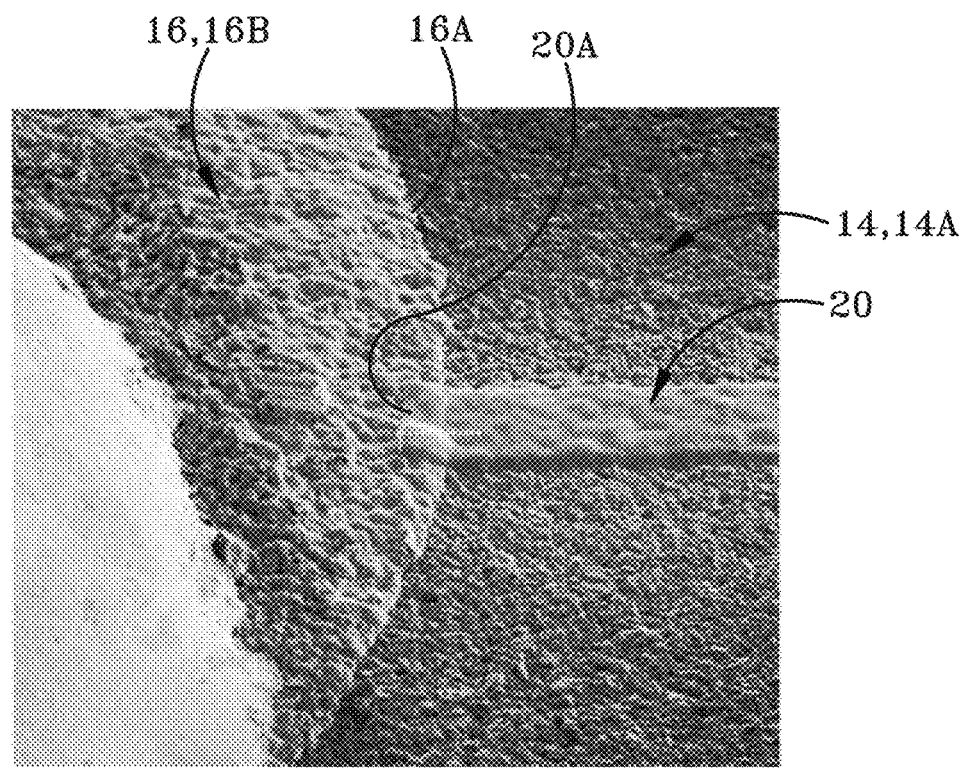
FIG. 4 shows a further image of a scanning electron microscopy image with a single exemplary contact on an exemplary LGA package that are connected by a single trace while on an exemplary substrate.
Figure 5:
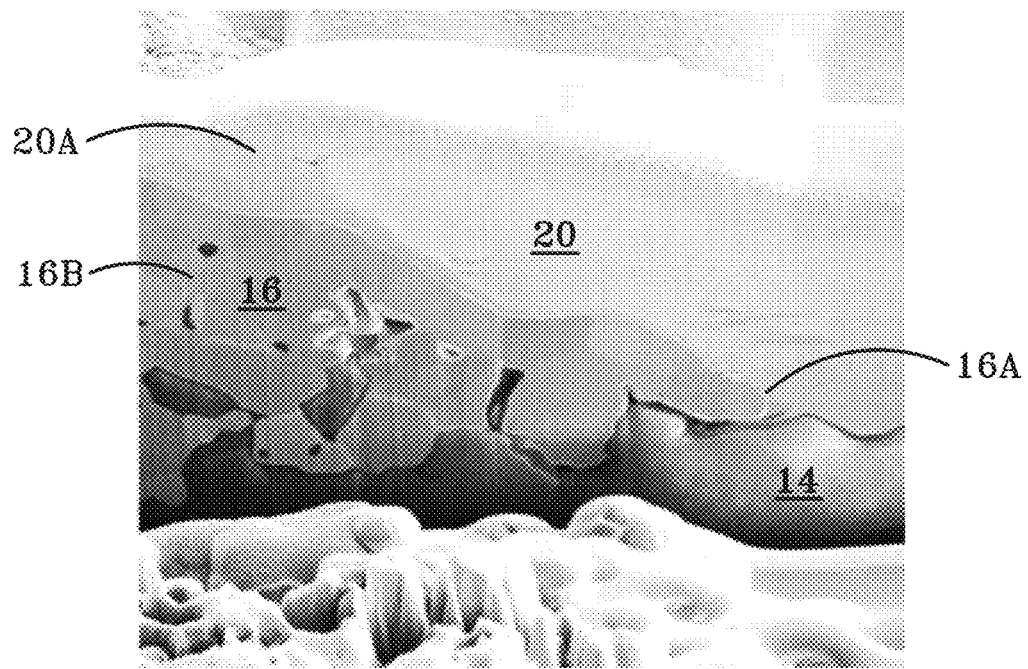
FIG. 5 shows a further image of scanning electron microscopy image in partial cross section.
Figure 6:
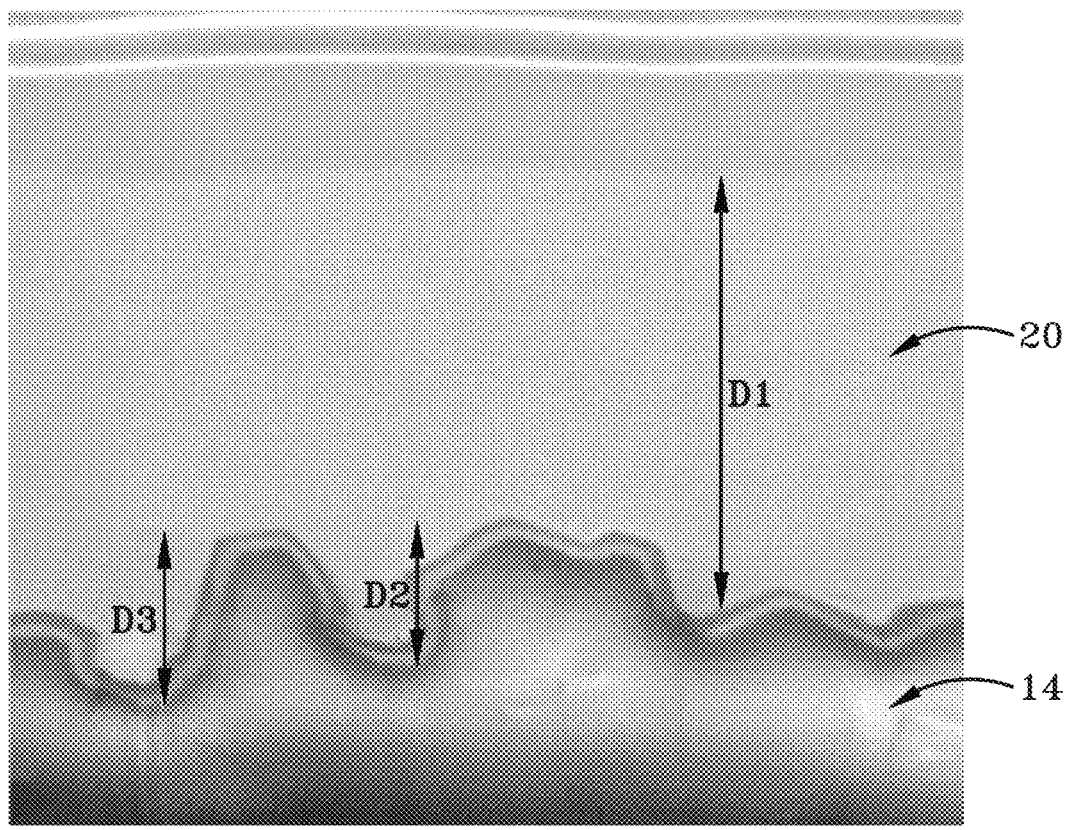
FIG. 6 shows a further image of a scanning electron microscopy image showing the thickness of the trace on a substrate.

Referring now to FIG. 4, FIG. 5 and FIG. 6, further images of scanning electron microscopy of a single exemplary contact 16 on an exemplary LGA package 10 that are connected by a single trace 20 while on an exemplary substrate 14. These views are all taken at a tilt angle of about 52 degrees. Referring specifically to FIG. 4, a tilted view of a single trace 20 is shown attached to a contact 16 is shown. The image is taken at a 5.00 kV electron acceleration voltage with a 5.180 mm free working distance at 1200 times magnification and a 253 μm horizontal field width. In this view the single trace 20 is attached at its first end 20A to the contact 16 operatively connected to a portion of the interior area 16B as well as the outer perimeter edge 16A.

Referring specifically to FIG. 5, a cross section of the trace 20 attached to the contact 16 is shown. The image is taken at a 5.00 kV electron acceleration voltage at 15000 times magnification and a 20.3 μm horizontal field width. In this view the single trace 20 is overlaid on the contact 16 as well as the substrate 14 that separates both physically and electrically the contact 16 from the contact 18 and further contacts.

As can be seen, the trace 20 is in operative connection the substrate 14 while maintaining electrical connection with the contact 16 at both its outer perimeter edge 16A and its interior area 16B. In this embodiment the contact 16 is made of gold and the trace 20 is made of platinum.

Continuing on to FIG. 6, a further cross sectional view of the trace 20 attached to the substrate 14 is shown. The image is taken at a 5.00 kV electron acceleration voltage with a 5.298 mm free working distance at 35000 times magnification and an 8.69 μm horizontal field width. In this view, the trace is shown to have a depth "D1". As discussed with respect to FIG. 2, the trace has a thickness, or depth, of 1-9 μm. In this view, the thickness is specifically 4.91 μm.

Further, there are shown other depths "D2" and "D3" that correspond to substrate irregularities. In this exemplary embodiment "D2" has a value of 1.97 μm and "D3" has a value of 1.6 μm. This is by no means limiting and is merely an exemplary embodiment showing that the trace material, in this case, platinum would extend into the substrate irregularities.

Having thus described an exemplary non-limiting configuration of the modified LGA package 10, its operation and method thereof of operation will be discussed with reference to some exemplary features used with the various embodiments.

After a circuit board or other complementary metal-oxide-semiconductor (CMOS) device is made, it is tested. After being tested, the device may be installed as part of an application of a greater system as a whole. However, at times, the board may not have been designed or executed in a way in which all pins and all contacts may be fully operational. Additionally, many defects may reduce reliability and long-term reliability is preferred in many applications. If a board does not behave correctly, in either the testing phase or after being installed, the board may be considered non-operational and the part or the system as a whole may be non-operational.

In the past, if a design flaw or design anomaly was found, it likely would need to be an integrated circuit redesign and a remanufacturing of the integrated circuit, package redesign and remanufacturing of the package design, or PCB design and remanufacturing of the PCB. All of these design or remanufactures have a large cost and schedule implications that may not meet the needs of a budget or customer. Many times, a deadline is promised to a client or a superior and if the device does not work, there is no time to try to fix the problem. As such, there is a greater need to repair these after-production devices. As used herein, after-production refers to a circuit board, integrated circuit or other related device that has been initially manufactured, but is deemed to be malfunctioning during testing or after installation.

Figure 7:
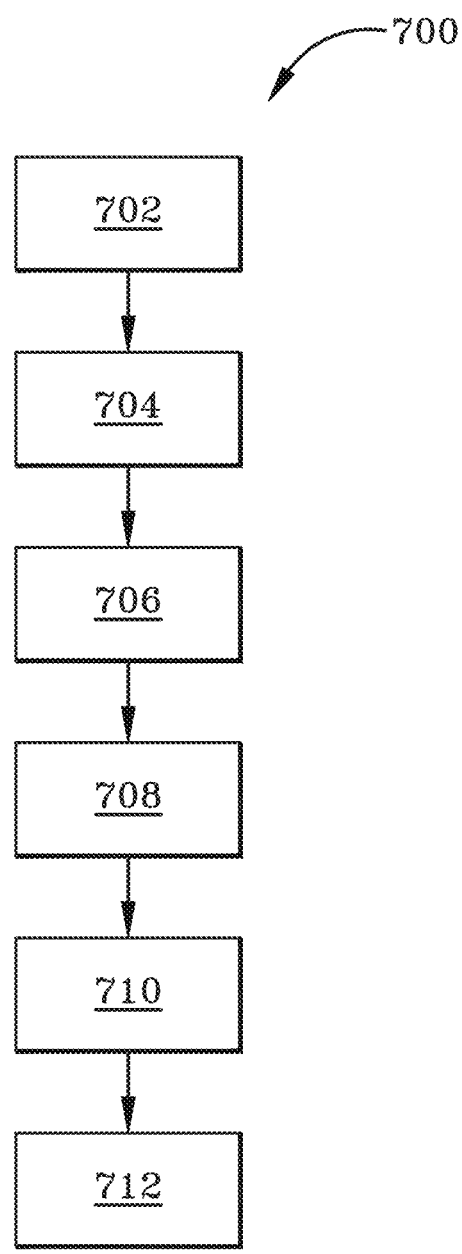
FIG. 7 shows an exemplary method described herein.

Referring specifically to FIG. 7, an exemplary method 700 is shown for repairing a circuit board having a manufacturing defect. In order to determine whether the present techniques are a solution, some level of diagnosing an error on an operative area of the circuit board causing a malfunction 702 is done. The malfunction can be, for example, a design flaw, a component failure, a pad contact failure and the like. Based on the malfunction, an assessment is done as to whether the malfunction relates to a solution that can be employed via coupling contacts and the location of the applicable contacts and the routing of the traces.

In one example, an ion chamber is used for depositing one or more traces to couple contacts. The circuit board is placed or loaded into a focused ion beam chamber 704. A metal precursor is introduced into the focused ion beam chamber 706, and the processing includes ionizing the metal precursor by contacting it with the ion beam, such as gallium, into a conductive metal and a further ion 708, depositing a first portion of a conductive metal onto a substrate to form a first trace 710 between the operative area and a non-operative area thereby connecting the operative area and the non-operative further area 712. In this example, it is coupling contacts to fix the malfunction.

However, if in the instance of an LGA package, if one of the contacts on the back side of the substrate is malfunctioning, it may be shorted together with a trace to a further contact. This trace would ideally result in a low current short, on the magnitude of microamps. The trace in one example is made by a Focused Ion Beam (FIB) system. Specifically, a metal precursor is introduced into a chamber of the FIB. A metal precursor may be a gaseous compound that is composed of a metal atom (or atoms) chemically bonded to a lighter radical. This radical is frequently organic and as such enables the composite material to be in the gaseous phase in vacuum levels typical for operation of FIBs. In the instance of platinum, an exemplary precursor may be methylcyclopentadienyl trimethyl platinum. In the instance of tungsten, an exemplary precursor may be tungsten hexacarbonyl. An ion beam is then activated in a scanning, or raster, pattern that will define the shape of the pattern to be deposited onto the substrate. When the ion beam rasters, it cleans the surface to an extent in order to put down a metal layer on a substrate surface. In an exemplary embodiment, the ion beam is a gallium beam powered by a high voltage power supply. The ion beam is operative to ionize the metal precursor into its pure metallic form and the radical.

Once the metal precursors are adsorbed to the surface of a substrate, and the FIB contacts the substrate, a metal layer is formed on the substrate. The metal layer is formed as a result of instructions sent to a controller or other computer media corresponding to data bearing records. In an exemplary embodiment discussed herein, the traces 20, 22 are about 5 μm thick while being about 40 μm wide. The distances could be larger or smaller, because of the low levels of resistance, they do not need to be so small. The length is dependent on the distance to an additional contact desired to be linked. Ideally, the trace will be as small as possible, to an adjacent contact. This is due to the fact that the time it takes to deposit a layer of metal onto the substrate is directly dependent to its size. As a result, the longer the trace, the longer it takes to apply the trace. As a result, the trace should be to adjacent contacts whenever possible. However, the trace could be to other contacts no matter where they may be on the substrate.

While in the exemplary embodiment two traces 20, 22 are shown, there could be as few as one trace or up to several traces. The decision for the number of traces in one example is based upon a functional element of the circuit as a whole. For example, where reliability may be desired, more than one trace may be utilized. This is due to the fact that if one trace were to become non-operational, there is a backup to still allow the contacts to be shorted together. Similarly, if a greater degree of reliability were to be desired, the traces could be duplicated by two or more traces.

In one embodiment, the trace connects a ground contact to voltage select contact. The low current of the voltage contact provides the low current requirement for the shorting of the contacts. When the two contacts are shorted together, the malfunctioning contact begins to act as its intended function. While the ground contact to the voltage select contact is one embodiment, other configurations are possible as long as the current is kept low. The contacts that art shorted together no longer act separately, but the underlying circuit will act as intended.

After adding the traces 20, 22 the resultant board was stress tested between temperatures of boiling water and into liquid nitrogen. The resultant traces 20, 22 were not affected by this swing in temperatures. An additional test that was performed was the liquid to liquid shock test, MIL-STD-883 Method 1011.9 Condition B. The resultant traces 20, 22 were similarly not affected by this test and continued to perform.

A number of other solutions to a malfunctioning board would use relatively large amounts of solder or other metals. Once the board is soldered, it no longer is able to be accurately inspected. As a result, many end use customers will turn down the product as they cannot guarantee what is on the board or contact because it is entirely covered. However, with the application of just traces 20, 22, the board is still readily able to be inspected as there is merely the traces connecting one or more contacts, not obscuring any of the board or its components.

While the exemplary embodiment concerns an LGA configuration with a non-functioning or malfunctioning contact further design issues could be corrected. These design issues may include but are not limited to any issue with the board, substrate or the die. For example, if any trace were left open on a board as a design flaw, this technique could be used to close the trace and allow the board to function as desired.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A method of modifying a portion of a substrate after production, said method comprising:
   identifying a first contact on the substrate;
   connecting, electrically, the first contact to a second contact on the substrate with at least one trace, wherein the trace is done with a focused ion beam;
   introducing the focused ion beam to the substrate containing the first contact and the second contact;
   presenting a metal precursor into a reaction chamber containing the substrate;
   ionizing the metal precursor with the focused ion beam into a metal portion and a further portion; and
   forming a layer of metal over the substrate resulting in an electric connection between the first contact and the second contact.

2. The method of claim 1, wherein the ion beam is a gallium ion beam.

3. The method of claim 1, wherein the layer of metal is platinum.

4. The method of claim 1, wherein the layer of metal is tungsten.

5. The method of claim 1, further comprising:
   executing a program with instructions dependent on data bearing records to form the layer.

6. The method of claim 1, further comprising:
   forming at least one additional connection between the first contact to the second contact.

7. The method of claim 6, wherein the first connection is a first metal trace line and the at least one additional connection is at least one further metal trace line that is offset parallel to the first metal trace line.

8. The method of claim 1, wherein the trace is in a range from 3 μm to 7 μm thick.

9. The method of claim 8, wherein the trace is about 5 µm thick.

10. The method of claim 1, wherein the trace is in a range from about 20 µm to about 60 µm wide.

11. The method of claim 10, wherein the trace is about 40 µm wide.

12. A method for repairing a circuit board for a manufacturing defect after production, said method comprising:
   introducing a metal precursor into a focused ion beam chamber;
   ionizing the metal precursor by contacting it with a gallium ion beam into a conductive metal and a further ion;
   depositing a first portion of a conductive metal onto a substrate to form a first trace; and
   forming the first trace between the operative area and a non-operative area thereby connecting the operative area and the non-operative area.

13. The method of claim 12, further comprising:
   depositing a second portion of a conductive metal onto a substrate to form a second trace; and
   forming the second trace between the operative area and the non-operative area thereby connecting the operative area and a further area.

14. The method of claim 13, wherein the conductive metal is tungsten.

15. The method of claim 13, wherein the conductive metal is platinum.

16. The method of claim 13, further comprising:
   depositing at least one further portion of conductive metal onto a substrate to form a plurality of traces; and
   forming the plurality of traces between the operative area and the further area.

* * * * *